United States Patent
Marsili et al.

(10) Patent No.: US 9,897,657 B2
(45) Date of Patent: Feb. 20, 2018

(54) METHOD AND APPARATUSES FOR DETERMINING A STATE OF CHARGE

(71) Applicant: Infineon Technologies AG, Neubiberg (DE)

(72) Inventors: Stefano Marsili, Faak am See (AT); Christoph Unterrieder, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 14/601,903

(22) Filed: Jan. 21, 2015

(65) Prior Publication Data

US 2015/0212160 A1     Jul. 30, 2015

(30) Foreign Application Priority Data

Jan. 30, 2014   (DE) .......................... 10 2014 101 157

(51) Int. Cl.
   *G01N 27/02*   (2006.01)
   *G01R 31/36*   (2006.01)

(52) U.S. Cl.
   CPC ........ *G01R 31/362* (2013.01); *G01R 31/3651* (2013.01)

(58) Field of Classification Search
   USPC ........................................................ 324/427
   See application file for complete search history.

(56) References Cited

U.S. PATENT DOCUMENTS

| 4,725,784 | A | * | 2/1988 | Peled | ................. | G01R 31/3648 |
|---|---|---|---|---|---|---|
| | | | | | | 320/149 |
| 6,366,054 | B1 | | 4/2002 | Hoenig et al. | | |
| 7,626,394 | B2 | * | 12/2009 | Kimura | ............. | G01R 31/3624 |
| | | | | | | 320/132 |
| 7,679,327 | B2 | * | 3/2010 | Kim | ...................... | H01M 10/44 |
| | | | | | | 320/132 |
| 7,768,233 | B2 | | 8/2010 | Lin et al. | | |
| 8,084,996 | B2 | * | 12/2011 | Zhang | ................ | G01R 31/3624 |
| | | | | | | 320/132 |
| 2004/0135544 | A1 | * | 7/2004 | King | ..................... | B60L 11/185 |
| | | | | | | 320/116 |
| 2010/0321025 | A1 | * | 12/2010 | Lin | ..................... | H01M 10/441 |
| | | | | | | 324/427 |
| 2011/0316547 | A1 | | 12/2011 | Liu et al. | | |
| 2012/0136594 | A1 | * | 5/2012 | Tang | .................. | G01R 31/3679 |
| | | | | | | 702/63 |
| 2012/0200298 | A1 | | 8/2012 | Zhang et al. | | |
| 2013/0046495 | A1 | * | 2/2013 | Sim | .................... | G01R 31/3658 |
| | | | | | | 702/63 |

FOREIGN PATENT DOCUMENTS

DE    102012002279 A1    8/2012

* cited by examiner

*Primary Examiner* — Samuel Berhanu
(74) *Attorney, Agent, or Firm* — Murphy, Bilak & Homiller, PLLC

(57) ABSTRACT

Methods and apparatuses for determining a state of charge of a battery are provided, wherein measurements of a terminal voltage of the battery and stored precharacterization parameters are used for determining the state of charge.

20 Claims, 8 Drawing Sheets

METHOD AND APPARATUSES FOR DETERMINING A STATE OF CHARGE

PRIORITY CLAIM

This application claims priority to German Patent Application No. 10 2014 101 157.0 filed on Jan. 30, 2014, the content of said application incorporated herein by reference in its entirety.

TECHNICAL FIELD

The present application relates to methods and apparatuses for determining a state of charge of a battery, for example a rechargeable battery, and to devices which comprise such apparatuses.

BACKGROUND

For the power supply to mobile portable devices such as mobile telephones, portable computers and the like or else for the power supply to other devices or technical devices such as vehicles, batteries, in particular rechargeable batteries, are often used. In German, such rechargeable batteries are also referred to as accumulators (Akkumulatoren or Akkus, for short). Irrespective of the type of battery used and the type of device, it is in this case often desirable to inform the respective user of the device of the state of charge of the battery so that the user notices in good time before the battery is empty and can no longer supply sufficient current, for example, with the result that the user can replace and/or recharge the battery before the device fails, for example.

Usually, in some applications, the state of charge of the battery is determined by an open terminal voltage of the battery being measured, i.e. a voltage in a state in which no load or else a low load (for example during standby operation) is coupled to the battery, i.e. in a state in which there is in any case a low current load. In this case, however, there is the problem that, after the beginning of the state of low current load, sometimes several hours can elapse until the open terminal voltage reaches a steady state (i.e. relaxation has finished), which makes such measurements very difficult to implement in many situations since often the battery is coupled to a higher load again within this time, i.e. a higher load current needs to be provided, for example in order to provide device functions.

In order to achieve rapid estimation of the state of charge of the battery, the open terminal voltage can be measured a plurality of times during a relaxation operation and an estimated value for the open terminal voltage in the steady state can be determined by extrapolation from the multiple measurements. On the basis of this estimated value, the state of charge can then be determined. This provides sufficient accuracy for many applications. However, for some applications it would be desirable to shorten the duration during which values for the open terminal voltage are measured, wherein a desired accuracy of the determination of the state of charge is still intended to be ensured.

SUMMARY

An object of the present invention is to provide methods and apparatuses in which a state of charge of a battery is determinable with sufficient accuracy within a relatively short period of time.

According to one embodiment of a method, the method comprises: detecting a state with low current load of a battery; detecting a terminal voltage of the battery in the state with low current load, before the terminal voltage reaches a steady state; and determining a state of charge of the battery based on: (a) the detected terminal voltage in the state with low current load and (b) a precharacterization parameter which is stored for a respective type of battery.

According to an embodiment of an apparatus, the apparatus comprises a detection apparatus, a memory and an evaluation apparatus. The detection apparatus is configured to detect a terminal voltage of a battery. The memory is configured to store a precharacterization parameter. The evaluation apparatus is configured to determine a state of charge of the battery based on (a) the terminal voltage detected by the detection apparatus and (b) an item of precharacterization information stored in the memory.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
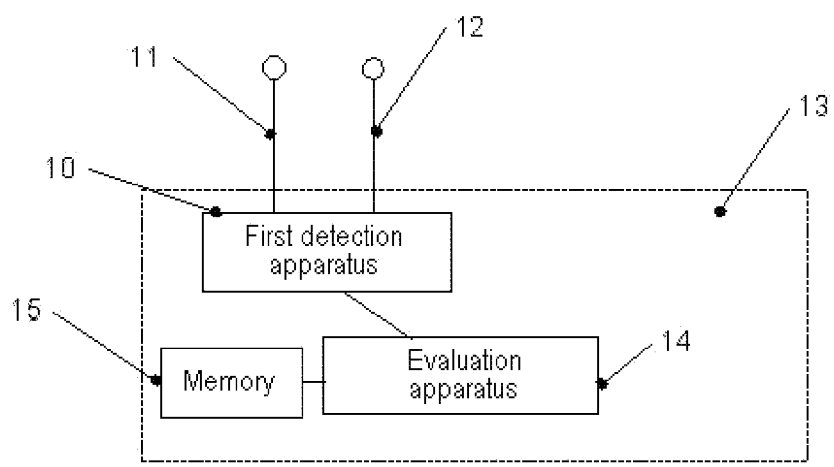
FIG. 1 shows a block diagram of an apparatus in accordance with an exemplary embodiment of the invention.

Exemplary embodiments of the present invention will be explained in detail below with reference to the attached drawing. It should be noted that these exemplary embodiments are intended merely for illustrative purposes in respect of possible implementations of the invention and should not be interpreted as being restrictive. In particular, features of different exemplary embodiments can be combined with one another, if not specified otherwise. On the other hand, a description of an exemplary embodiment with a multiplicity of features should not be interpreted as meaning that all of these features are required for implementing the invention since other exemplary embodiments can have fewer features and/or alternative features.

In various exemplary embodiments, a steady-state value of a terminal voltage is determined approximately by virtue of the terminal voltage of a battery being measured one or more times shortly after the beginning of a state with a low load current, i.e. a load current below a threshold value, in particular prior to a steady state being reached. On the basis of these measurements and at least one precharacterization parameter, an estimated value for a steady-state value of the terminal voltage can then be determined, and a state of charge of the battery can be determined from this in turn.

A precharacterization parameter is in this case generally a parameter which characterizes a behavior of a specific battery type, in particular during relaxation. Such a precharacterization parameter can be obtained, for example, in the case of a single characterization of a battery of a specific type and then stored for later use. In some exemplary embodiments, such a precharacterization parameter can also be updated. For example, a characterization of the battery can be performed for this purpose, for example at a time at which an apparatus to which current is supplied by means of the battery is not required, in order to obtain one or more updated precharacterization parameters.

In some exemplary embodiments, quicker determination of the state of charge with a desired accuracy can be achieved by the use of a precharacterization parameter.

A state of charge is in this case generally understood to mean an item of information which describes to what extent a battery is discharged or charged. There are a large number of various possible ways of indicating this state of charge. For example, a degree of charge can be specified as a percentage (for example 60% charge), and a degree of discharge can be specified as a percentage (for example 40% discharge) or a remaining residual capacity (for example in mAh) can be specified. These various representation methods include the same basic information. Thus, in the case of a 1000 mAh battery, for example, a degree of charge of 60% corresponds to a degree of discharge of 40% or a residual capacity of 600 mAh.

In some exemplary embodiments, the measured values of the terminal voltage are matched on the basis of the precharacterization parameter, and then the estimated value for the terminal voltage in the steady state is determined on the basis of the matched measured values, for example by extrapolation and/or a fit operation.

The precharacterization parameter can in this case also be dependent, for example, on further parameters, for example a temperature or an estimated state of charge. For example, in such a case, the precharacterization parameter can be stored in table form depending on other parameters. In other exemplary embodiments, the precharacterization parameter can also be scaled depending on a previous battery current (charging current or discharge current).

In some exemplary embodiments, optionally in addition corrections on the basis of operating circumstances, in particular a "history", of the battery are used to determine the state of charge of the battery, for example items of information on previous charging and/or discharge operations, for example on the basis of charging currents and/or voltages across the battery during a charging and/or discharging state or else items of information in respect of a temperature, a degree of aging, heat generation or heat transfer of the battery. It should be noted that, within the context of the present application, a battery current can be negative or positive, depending on whether the battery is charged (charging current) or discharged (discharge current) by the battery current.

Such corrections on the basis of operating circumstances can be taken into consideration directly in the abovementioned fit in some exemplary embodiments by virtue of a function used in such a fit being modified correspondingly. In other exemplary embodiments, a determination of the state of charge takes place depending on the steady-state terminal voltage determined as above without taking into consideration the corrections and additionally depending on the corrections, for example by means of a corresponding table which indicates the state of charge for various values of the approximate steady-state terminal voltage and various values for the correction(s).

FIG. 1 illustrates schematically an apparatus 13 in accordance with an exemplary embodiment with which a state of charge of a battery can be determined. The apparatus 13 comprises a detection apparatus 10, with which a terminal voltage of a battery can be detected. In order to detect the terminal voltage, the detection apparatus 10 can be coupled to the battery via connections 11, 12.

Optionally, further detection devices for detecting further variables such as, for example, temperature or battery current can be provided.

In addition, the apparatus 13 comprises an evaluation apparatus 14, which is coupled to a detection apparatus 10 and which is designed to determine a state of charge of the battery. For example, the evaluation apparatus 14 can receive an item of information to the effect that the battery is in a state of low current load. This can take place, for example, by measurement of a battery current via a further detection apparatus (not illustrated) or by an external signal, which can indicate, for example, that an apparatus which comprises the battery has been switched to an open-circuit state.

A state of low battery current can be present, for example, when the battery current is below a threshold value, which may be in a range of $\frac{1}{20}$ C to $\frac{1}{30}$ C, for example. "C" is in this case a conventional unit which is dependent on the capacitance of the battery. A current of 1 C is 1.9 A for a 1.9 Ah battery, for example.

Such a state with low current load can be present, for example, when a load or part of a load is isolated from the battery or an apparatus to which current is supplied by the battery is set to an open-circuit state, also referred to as standby state.

If such a state of low current load is detected, the evaluation apparatus 14 can receive one or more voltage measured values of the terminal voltage of the battery via the detection apparatus 10. In addition, the evaluation apparatus 14 is coupled to a memory 15. One or more precharacterization parameters can be stored in the memory 15. On the basis of one or more of the stored precharacterization parameters and the detected voltage measured values of the terminal voltage, the evaluation apparatus 14 can then determine an estimated value for the open terminal voltage in the steady state and, from this, a state of charge of the battery.

Figure 2:
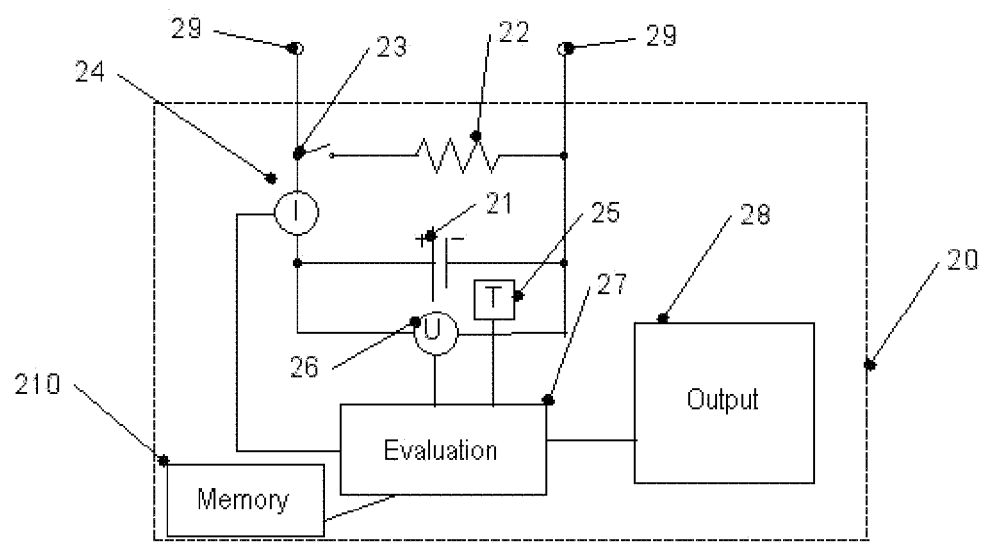
FIG. 2 shows a block diagram of an apparatus in accordance with a further exemplary embodiment of the invention.

FIG. 2 illustrates an apparatus 20 in accordance with a further exemplary embodiment. The apparatus 20 can be, for example, an electronic device which is supplied by a battery 21, for example a rechargeable battery such as a lithium battery. In addition, the apparatus 20 comprises an apparatus for determining the state of charge of the battery 21 in accordance with an exemplary embodiment. The apparatus 20 can be, for example, any type of device which has electrical components to which electric current is supplied wholly or partially by a battery such as the battery 21.

For example, the apparatus 20 can be a portable mobile device such as a mobile telephone (including smart phones), a portable navigation device or a laptop computer, but is not restricted to such portable mobile devices, but can also be a vehicle, for example, which has a battery, or a stationary device having a battery. It should be noted that the battery 21 can comprise a single cell or else a plurality of cells connected in series or parallel, in particular electrochemical cells.

Electrical components to which current is supplied by the battery 21 are symbolized by a load 22 in the illustration in FIG. 2. These electrical components can include any type of circuits, devices or other electrical components which are required for providing the functionality of the apparatus 20, for example communication circuits for wireless communication in the case of a mobile telephone.

The load 22 can be electrically isolated from the battery 21 with the aid of a switch 23, for example a switch based on transistors such as field-effect transistors or bipolar transistors, which is desirable, for example, in order to save current when the electrical devices symbolized by the load 22 are not required. In other exemplary embodiments, no such switch is provided, and a current load is for example reduced in a standby state, for example by virtue of components of the load 22 being partially disconnected or by lower currents being supplied during an open-circuit state. In such cases, the switch 23 can be understood as a symbol of the possibility of reducing the current load, but it should be emphasized that, in such an open-circuit state, a low current load may quite possibly still be present in many applications, for example in order to ensure certain standby functions.

In the case of a rechargeable battery 21, in addition connections 29 can be provided, via which the battery 21 can be charged by coupling to an electricity grid, for example. In other exemplary embodiments, the battery 21 can additionally or alternatively also be removable from the apparatus 20 and inserted into a special charger for charging.

In the exemplary embodiment shown in FIG. 2, in addition a current-measuring device 24 is provided in the apparatus 20 in the case of the battery 21 in order to be able to measure a battery current, for example a discharge current flowing out of the battery 21 (for example for supplying power to the load 22) and/or a charging current flowing into the battery 21 (for example from the connections 29). The current-measuring device 14 is an example of a further detection apparatus as discussed with reference to FIG. 1. In addition, in the exemplary embodiment shown in FIG. 2, a voltage-measuring device 26 is connected in parallel with the battery 21, as illustrated, in order to be able to measure a terminal voltage present at the battery 21, wherein the voltage-measuring device 26 is an example of the detection apparatus 10 in FIG. 1. In particular, in the case in which the load 22 is isolated from the battery 21 by opening of the switch 23, an open terminal voltage of the battery 21 can be measured, or in a state of low current load, a terminal voltage can be measured which can act as approximation value for the open terminal voltage, or on the basis of which an approximation value for the open terminal voltage is determinable. Finally, in the exemplary embodiment in FIG. 2, a temperature sensor 25 is provided, via which a temperature of the battery 21 can be measured. It should be noted that the use of the temperature sensor 25 is optional, and the temperature sensor 25 can be omitted in other exemplary embodiments. In yet further exemplary embodiments, in addition or alternatively the current-measuring device 24 can be omitted.

Operating circumstances of the battery 21, in particular a voltage across the battery during charging or discharging, charging and discharging currents or the operating temperature of the battery 21, are detectable via the voltage-measuring device 26, the current-measuring device 24 and/or the temperature sensor 25.

The current-measuring device 24, the temperature sensor 25 and the voltage-measuring device 26 are connected to an evaluation apparatus 27. The evaluation apparatus 27 is in this case designed to detect one or more voltage values of the terminal voltage of the battery 21 after a transition to a state of low current load by means of the voltage-measuring device 26, wherein this can take place in the relative short term after the transition to the state of low current load, in particular before a terminal voltage of the battery 21 reaches a steady-state value.

In addition, the apparatus 20 in FIG. 2 has a memory 210, in which precharacterization parameters can be stored, as explained above. Then, a state of charge of the battery 21 can be determined on the basis of the detected terminal voltage(s) and one or more stored precharacterization parameters, as will be explained in more detail later. In this case, the operating circumstances of the battery 21 detected by means of the current-measuring device 24 and/or the temperature sensor 25 can be used in some exemplary embodiments to improve the accuracy of the result, compared with a case which operates only on the basis of voltages.

In addition, the operating circumstances can be used in some exemplary embodiments to select one or more precharacterization parameters from a set of stored precharacterization parameters.

More precise details and examples of such an evaluation will be explained in more detail later. The result of the evaluation can then be indicated optically or acoustically, for example, by means of an output 28 to a user of the device 20. For example, the state of charge of the battery 21 can be represented graphically or can be output as a percentage, wherein a state of charge of 100% can correspond to a completely charged battery 21, for example. The current-measuring device 24 and/or the voltage-measuring device 26 can be implemented, for example, in a conventional manner by means of analog-to-digital converters in order to enable a digital evaluation by the evaluation apparatus 27.

Figure 3:
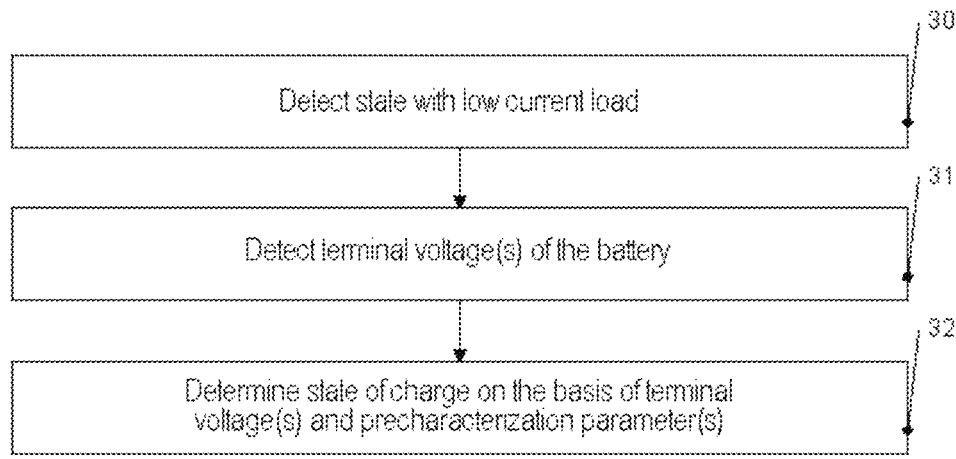
FIG. 3 shows a flow chart for illustrating a method in accordance with an exemplary embodiment of the invention.

FIG. 3 shows a flow chart for illustrating a method in accordance with an exemplary embodiment of the present invention. The method illustrated in FIG. 3 can be implemented, for example, in the apparatus 13 in FIG. 1 or the apparatus 20 in FIG. 2, but can also be used independently of this.

At 30, a state with low current load is detected. The presence of the state with low current load can be established, for example, when a battery current of the battery is below a predetermined threshold value or can be detected by virtue of a signal being received which indicates that an apparatus supplied by the battery has been set to an open-circuit state.

At 31, one or more terminal voltages of the battery (which correspond, for example, to at least approximately open terminal voltages) are then measured in the state with low current load. This detection of the terminal voltage(s) can take place in particular at one or more times before the terminal voltage assumes a steady state.

At 32, the state of charge of the battery is then determined on the basis of the one or more terminal voltages detected at 31 and one or more precharacterization parameters. The precharacterization parameters can in this case be stored in a memory and may have been predetermined for a respective cell type, for example a specific type of battery of a specific manufacturer, for example by a manufacturer of the battery or a manufacturer of an apparatus which is used for implementing the method in FIG. 3, for example the apparatus in FIG. 1 or the apparatus in FIG. 2.

Figure 4:
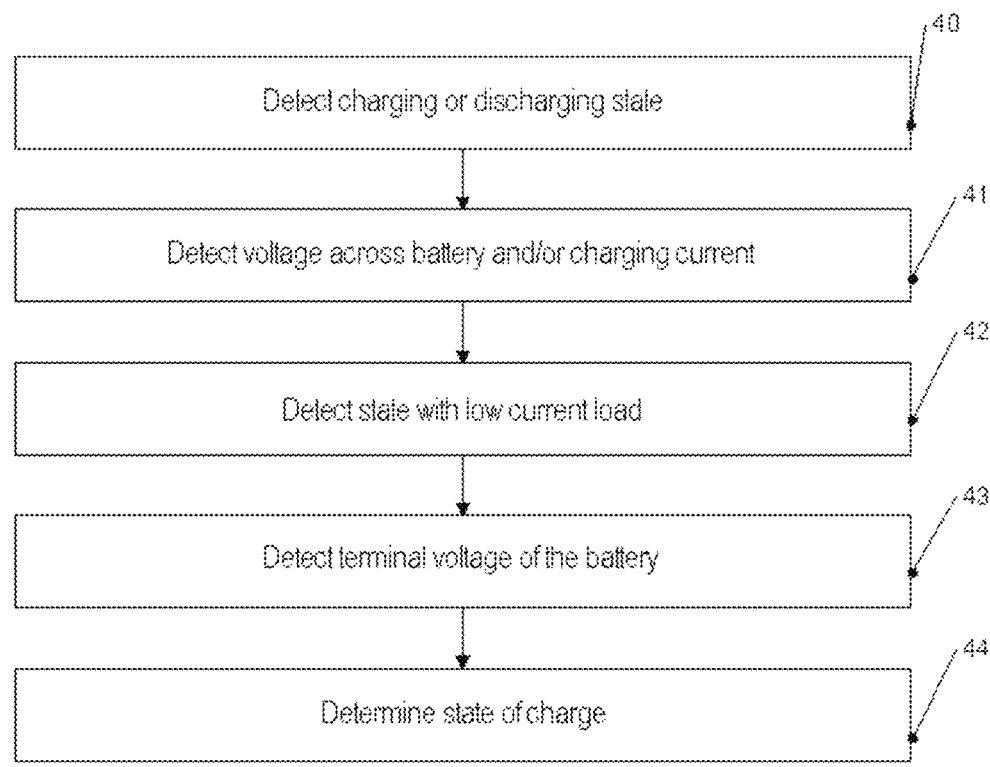
FIG. 4 shows a flow chart for illustrating a method in accordance with a further exemplary embodiment of the invention.

FIG. 4 shows a flow chart for illustrating a method in accordance with a further exemplary embodiment of the present invention. The method illustrated in FIG. 4 can be implemented, for example, in the apparatus 13 in FIG. 1 or the apparatus 20 in FIG. 2, but can likewise also be used independently thereof.

At 40, a state of charging or discharging of a battery is detected. This can take place, for example, by virtue of a battery current of the battery being detected and it being established that the state of charging or discharging is present when the battery current is above a first predetermined threshold value.

At 41, in this state of charging or discharging, a voltage across the battery and/or a battery current of the battery with which the battery is charged or discharged is detected.

At 42, a state with low current load is then detected. The presence of the state with low current load can be established, for example, when the battery current of the battery is below a second predetermined threshold value, wherein the second predetermined threshold value is less than or equal to the first predetermined threshold value.

At 43, the terminal voltage of the battery, i.e. a voltage across the battery, is then detected in the state of low current load. This detection of the terminal voltage can take place in particular at one or more times before the terminal voltage assumes a steady state.

At 44, the state of charge of the battery is then determined on the basis of the terminal voltage(s) detected at 43, on the basis of one or more precharacterization parameters and on the basis of the voltage detected at 41 and/or the charging current detected at 41, i.e. on the basis of voltage and/or charging current in a state of charging or discharging prior to the state with low current load, in which the terminal voltage(s) of the battery is (are) detected. In this case, the voltage detected at 41 and/or the charging current detected at 41 can be used in particular for correcting a value of the state of charge, which is determined on the basis of the terminal voltage detected at 43 and the precharacterization parameters. In the exemplary embodiment shown in FIG. 4, therefore, in addition to the one or more terminal voltages and the one or more precharacterization parameters, items of information relating to a state of charging or discharging which preceded the state of low current load, i.e. items of information on a history, are also used. In addition, such items of information or else items of information on a temperature can be used to provide one or more suitable precharacterization parameters from a set of stored precharacterization parameters.

For example, by integration of the battery current in a state of discharging or charging, the state of charge of the battery can be determined approximately from a previous state of charge, and a precharacterization parameter can be selected depending on this approximately determined state or charge. In other exemplary embodiments, one or more precharacterization parameters can also be determined additionally or alternatively depending on a temperature. Such a set of precharacterization parameters can be stored in a table, for example, and then selected depending on the estimated state of charge and/or temperature.

The use of precharacterization parameters will now be explained in more detail below on the basis of examples.

Figure 5:
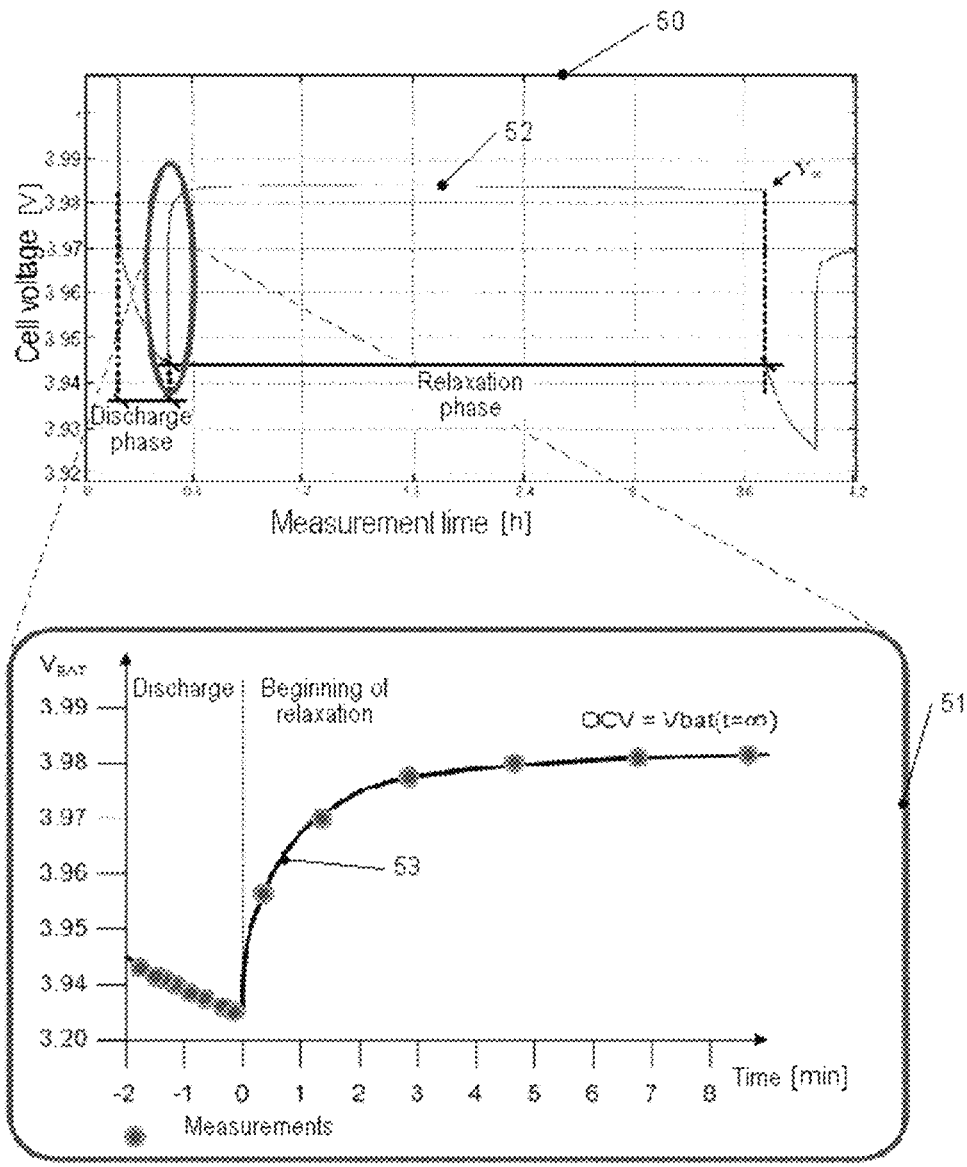
FIG. 5 shows graphs for illustrating a relaxation operation.

FIG. 5 shows a relaxation process schematically, wherein graph 51 shows an enlarged detail of graph 50. The graphs 50 and 51 each show the cell voltage, i.e. the terminal voltage of a battery comprising one or more cells, as a function of time. In this case, the graph 51 shows in particular, in enlarged form, a transition from a discharge phase to a relaxation phase (for example a state of low current load). A curve 52 in graph 50 in this case shows the cell voltage as a function of time over several hours, where $V\infty$ denotes a substantially steady-state value, which is detected approximately 3 hours after the beginning of the relaxation phase.

A curve 53 in FIG. 5 shows in particular a beginning of the relaxation in which the cell voltage (open terminal voltage, also shortened to OCV) still changes quickly. The individual points show, for example, measurement points in the method in FIG. 4 (measurement both in the discharge phase and also at the beginning of relaxation), while also only the measurement points can be used during the relaxation for example for the method in FIG. 3. A value of $V_\infty$ or another required value, as will be explained in more detail later, can then be estimated from these measurement points, for example by means of fitting.

Figure 6:
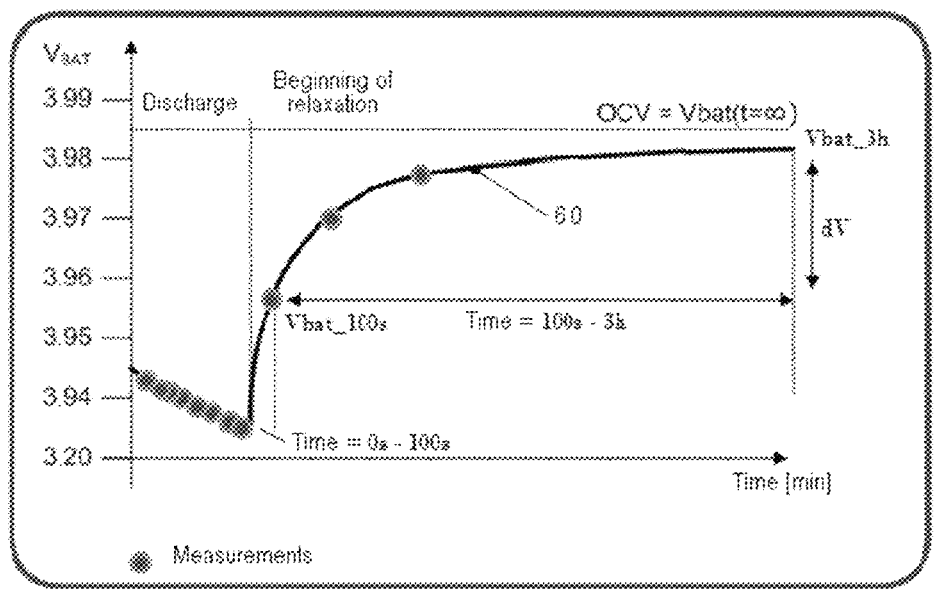
FIG. 6 shows a graph for illustrating a possible precharacterization parameter.

FIG. 6 shows a curve 60 illustrating the behavior of the battery with a discharge phase and at least part of a relaxation phase, similar to the illustrations in FIG. 5. A zero point on the time scale in this case corresponds to the transition from discharge to relaxation, i.e. a transition to a state of low current load. In FIG. 6, the relaxation is in this case split into different phases, comprising a first phase of 0-100 s and a second phase of 100 s to 3 h. A voltage difference between the battery voltage at a time 100 s and the battery voltage at a time 3 h is denoted by dV. The parameter dV is an example of a possible precharacterization parameter. It should be noted that, instead of the time limits 100 s and 3 h for the determination of dV, other times can also be used in other exemplary embodiments, for example a first time limit between 50 s and 200 s and a second time limit between 1 h and 4 h.

In general, the parameter dV is dependent on various state parameters, for example:

$$dV=f(\text{SoC},T,I,t) \tag{1},$$

where f is a function which is dependent on the state of charge SoC, on the temperature T, on a flowing current I, for example a battery current in a previous charge/discharge phase or else on a duration t of a previous charge/discharge phase. The precharacterization parameter dV can be determined depending on these variables or else on some of these variables during a characterization of a specific type of battery cell. In some exemplary embodiments, the precharacterization parameter dV can also be scaled on the basis of one or more of the state parameters. For example, a precharacterization parameter can be stored and then scaled depending on a battery current of a previous charge or discharge phase. Corresponding scaling factors can likewise be determined during the characterization (for example on the basis of the stored value for dV and, during the characterization of determined values for dV, for specific battery currents). The precharacterization parameter dV can then be used during operation for quicker determination of a state of charge of a battery of the corresponding type, as will be explained in more detail below.

For use, dV can in this case be interpolated between stored values, for example. In other exemplary embodiments, values which form parameters of a function from which dV can then be determined can also be stored.

Figure 7:
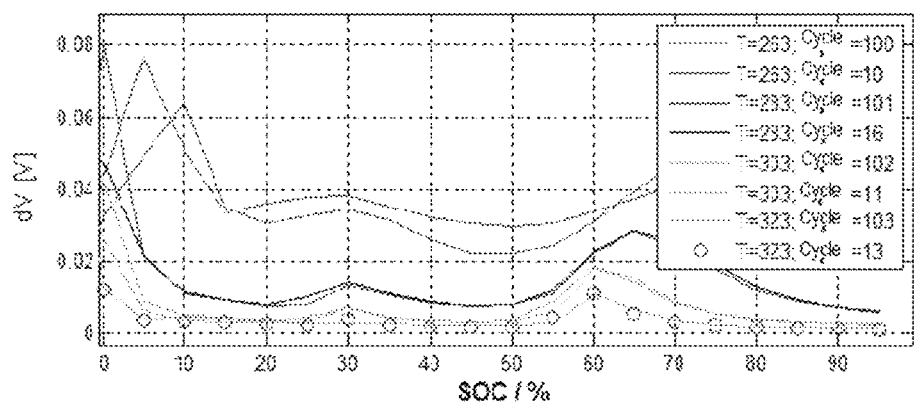
FIG. 7 shows a graph for illustrating the dependence of a precharacterization parameter on temperature and state of charge.
Figure 8:
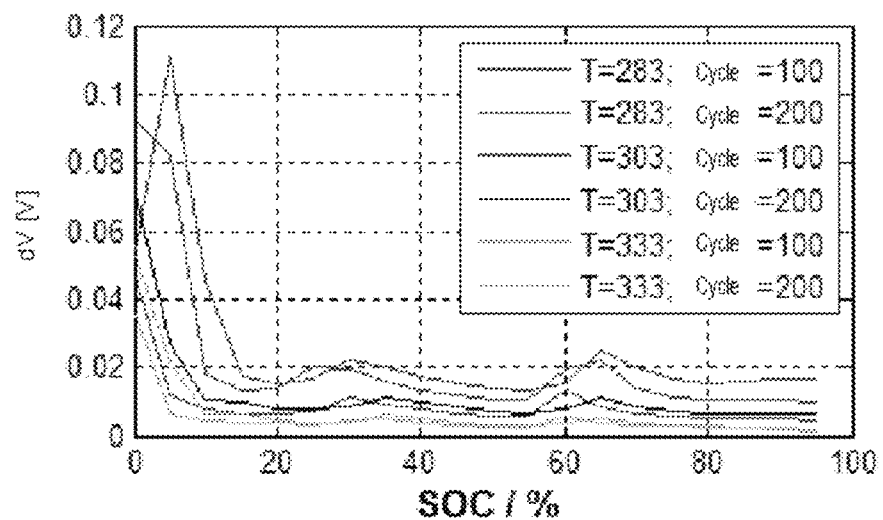
FIG. 8 shows graphs for illustrating the dependence of a precharacterization parameter on temperature and state of charge for a different type of cell from that in FIG. 7.

FIGS. 7 and 8 in this case show the profile of dV (in volts) under various conditions. In this case, FIG. 7 shows results for a type of cell, while FIG. 8 shows results for another type of cell of another manufacturer. In FIG. 7, in this case a lithium polymer battery has been used, and in FIG. 8 a lithium-ion battery has been used. In order to record the curves illustrated, the state of charge was lowered in each case by 5% starting from a completely charged battery by pulsed discharges with 0.1 C, followed in each case by a 3 hour rest phase for relaxation and for recording the value dV. FIGS. 7 and 8 in this case show measurements for various temperatures, wherein the temperatures are given in Kelvin. In addition, the measurement was repeated a number of times, and in each case measurements for two different cycles for each temperature are shown. By virtue of measurement over a plurality of cycles (for example by comparison of a measurement after 10 cycles and 100 cycles), an effect of an aging behavior of the respective battery can be investigated.

It can be seen from FIGS. 7 and 8 that the parameter dV only changes slightly with increasing aging (i.e. increasing number of cycles) at least for many temperatures. This demonstrates that the value dV for a specific temperature can be used in principle as precharacterization parameter independently of the age of the cell.

Figure 9:
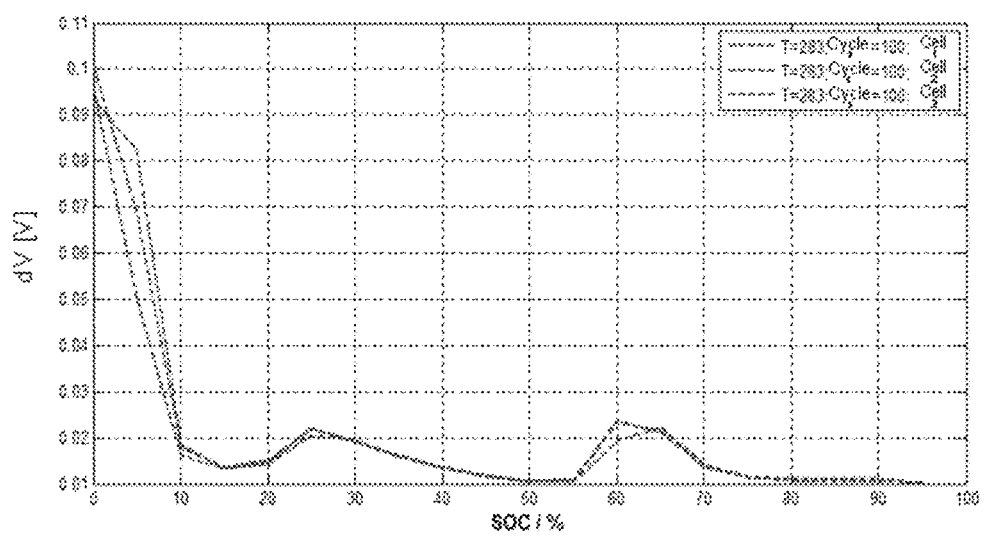
FIG. 9 shows graphs for illustrating a variation of a precharacterization parameter between different cells of the same cell type.

FIG. 9 illustrates a graph which shows a profile of dV, which has been recorded by means of the above described method, depending on the state of charge for three different cells of one type (i.e. of the same type). In this case, measurements were taken in each case after 100 cycles, and the temperature was 283 Kelvin. As can be seen, the three curves barely differ from one another. In other words, dV actually represents a precharacterization parameter, which is substantially applicable for a cell type and which is not significantly dependent on the respective example of the cell type. This also shows that dV can be used as precharacterization parameter.

In exemplary embodiments, measured values of the open terminal voltage in a relaxation phase (for example measured values in the relaxation phase as illustrated in FIG. 5 or 6) can then be corrected on the basis of the precharacterization parameter dV. The corrected values can then be used as the basis for a determination of an estimated value of the open terminal voltage, for example by means of a conventional extrapolation method with or without additional consideration of a history of the battery, i.e. previous load currents and the like.

Figure 10:
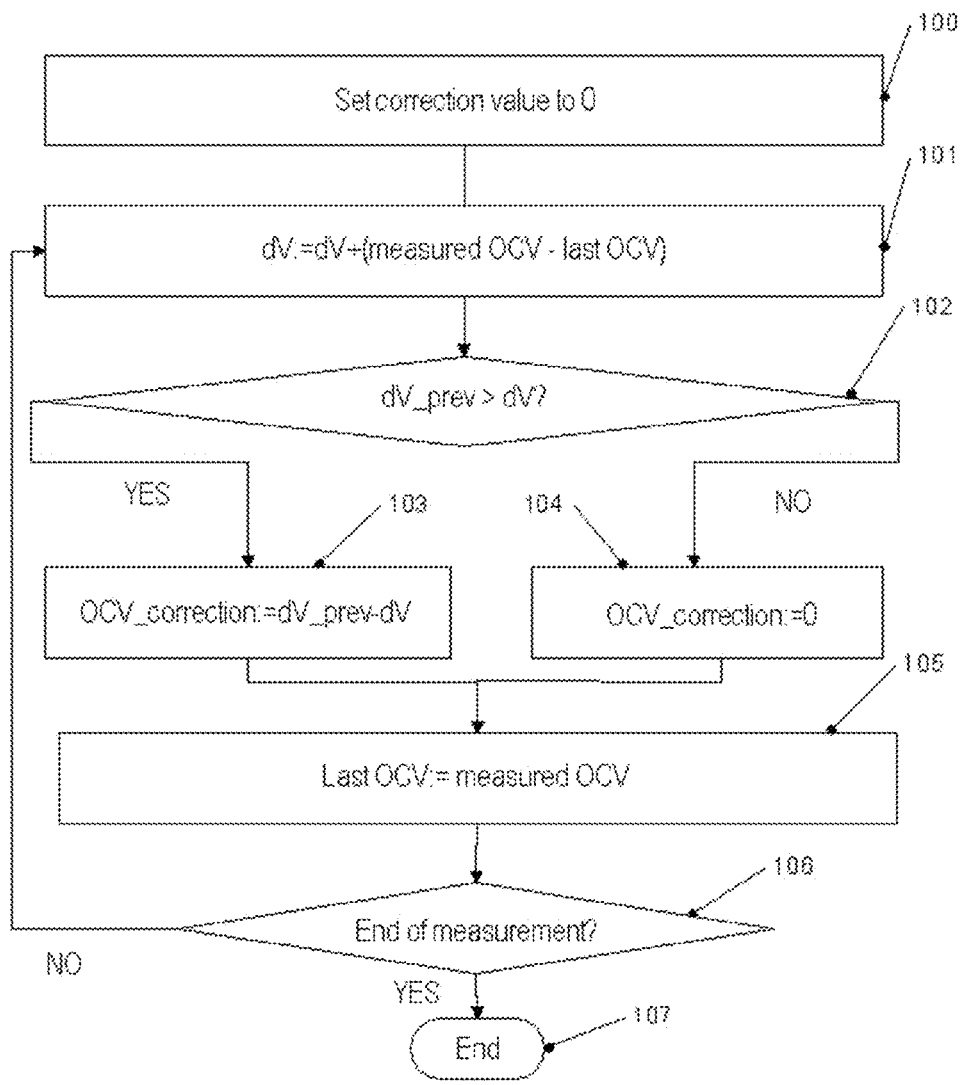
FIG. 10 shows a flow chart for illustrating a method in accordance with an exemplary embodiment of the invention.

A method in accordance with an exemplary embodiment by which such correction values for measured values can be determined is illustrated in FIG. 10.

The method shown in FIG. 10 should only be considered by way of example, however, and precharacterization parameters can also be used differently. For example, the precharacterization parameter dV can be used to select an increment for an estimator, which performs the extrapolation, for example an increment which is used by an algorithm determined for a fitting operation. In this case, the values of dV for which what increment for quick extrapolation is favorable can be determined, for example, by a series of tests or by means of a grid search (so-called grid-search algorithm).

In yet further exemplary embodiments, in addition or as an alternative to the value dV, such an increment can also represent a precharacterization parameter. For this, it is possible to determine, for example during a characterization, a table with increments $\mu$ a depending on the temperature and the state of charge of a battery. This can in turn take place by means of a grid search for $\mu$ (on the basis of measurement data of relaxation phases at different temperatures and states of charge). During operation, then, in the event of the occurrence of a relaxation phase, first the approximate state of charge is estimated on the basis of the battery current by integration, as already mentioned, the temperature is measured, then the corresponding $\mu$ according to the table is set in an estimator, and then the extrapolation is performed with the aid of the estimator.

At 100, a correction value is initialized to 0. At 101, an actual value of dV is updated by virtue of a difference between an instantaneously measured value of the terminal voltage (measured OCV) and the terminal voltage measured previously as the last measured terminal voltage (last OCV) is added to a previous value of dV. This actual value of dV therefore corresponds to a voltage difference accumulated over a plurality of measurements. At 102, a check is performed to ascertain whether a precharacterization parameter for dV, in this case referred to as dV_prev, is greater than the value (measured value) of dV updated at 101. If so, a correction value OCV_correction is calculated at 103 as the difference between the precharacterization parameter dV_prev and the actual value dV updated at 101. If not, the correction value OCV_correction for the instantaneous measured value is set to 0 at 104.

In any case, the last terminal voltage is then updated at 105 for use in step 101, i.e. is set to the terminal voltage just measured. Then, at 106, a check is performed to ascertain whether the measurement is complete. If not, the method is continued at 101 for a next measured value, and if so the method is ended at 107.

The method in FIG. 10 can be implemented every 100 s, for example. If measured values of the terminal voltage are recorded more frequently, a corresponding correction value, which was determined at 103 and 104, can be used for all measured values recorded between two runs of the method in FIG. 10. The correction value thus determined can then be added in each case to the measured value in order to determine a value for implementing an extrapolation method.

For the extrapolation of a profile of the terminal voltage Vt(t), a function of the form:

$$Vt(t) = Vinf - a \cdot \exp(b/t) \cdot t^c \quad (2)$$

can be used, for example, wherein other functions are also possible. Vinf, a, b and c are in this case parameters which can be determined, for example, by fitting, and t is the time. Once the parameters have been determined by a fitting process, an estimated value for the terminal voltage can then be determined at a desired time t, which estimated value can then be used for determining the state of charge in turn.

In other exemplary embodiments, as already mentioned, a history is additionally also taken into consideration, for example what battery current (charging current or discharging current) has been applied to the battery over what duration prior to a relaxation phase. This will be explained in somewhat greater detail below.

In general, the terminal voltage yk of a battery can be written as, for example:

$$y_k = OCV(SoC) - R \cdot i_k - U(T) + h_k \quad (3),$$

where OCV(SoC) is the open terminal voltage, which is dependent on the degree of discharge SoC, R is an internal resistance of the battery, which causes a voltage drop in the case of a charging/discharging current step ik, U(T) denotes a voltage share which is dependent on a time constant T and reflects, for example, chemical processes such as diffusion, and hk is a hysteresis term which has the effect that the open terminal voltage has different values after the relaxation depending on the history (different charging/discharging currents).

In order to determine the state of charge of a battery, as mentioned above, a suitable function can be selected, which is then matched to measured voltage values after the isolation of the battery from the load. A possible description of the time profile of the terminal voltage Vt(t), where t is time, is as follows:

$$Vt(t)=Vinf-a\cdot\exp(b/t)\cdot t^c+h1+h2. \quad (4)$$

Here, Vinf, a, b and c are parameters which can be determined in particular by fitting of the function of equation (4) to measured voltage values, exp is the exponential function and h1 and h2 are correction terms, which can reflect hysteresis effects and temperature effects, for example. The initialization of the parameters, for example Vinf, a, b and c, can in this case take place for example on the basis of measured currents which are flowing, for example, while the battery is in a state of charging or discharging, and/or depending on other functions such as, for example, the age of the battery and/or the impedance of the battery. For example, by integration of these currents, approximately a state of charge, such as a degree of discharge, for example, can be determined, and this approximately determined degree of discharge can be used as a basis for the determination of starting points for the parameters for a subsequent matching (fitting) of the function as suitable voltage values. For the fitting process, any desired conventional fitting process, for example on the basis of the least-square fitting method or the least-mean-square fitting method, can then be used.

The correction values h1 and h2 can likewise be determined, for example, on the basis of the measured currents and/or on the basis of measured temperatures. It should be noted that in some exemplary embodiments it is also possible for only a single correction value to be used and/or for only some influences or operating conditions of the battery to be taken into consideration. For example, correction values for various previous charging and discharging operations for a specific battery type can be determined during a calibration phase experimentally and then read out of the table during operation depending on detected charging and discharge currents. The same applies for different temperature values.

In some exemplary embodiments, equation (4) including the correction values can be matched to a measured curve, and then an approximation value for the steady-state open terminal voltage can be determined from the equation. In other exemplary embodiments, the correction values h1 and h2 can initially be omitted from the matching process and then subsequently taken into consideration.

Omitting h1 and h2, for this equation (4) can also be written as:

$$\log(Vinf-V(t))=\log(a)+(b/t)+c\cdot\log(t) \quad (5)$$

With this function, fitting can then be performed as already explained in order to determine thus the parameters Vinf, a, b and c. Then, in turn a value for V(t) can be extrapolated for any desired times by virtue of the determined parameters being inserted into equation (2) (possibly omitting h1 and h2). For example, a value for t=3 hours can be extrapolated for a subsequent determination of the state of charge, but another time can also be selected. In exemplary embodiments, the time is in this case selected in such a way that it at least approximately corresponds to a steady state.

Figure 11:
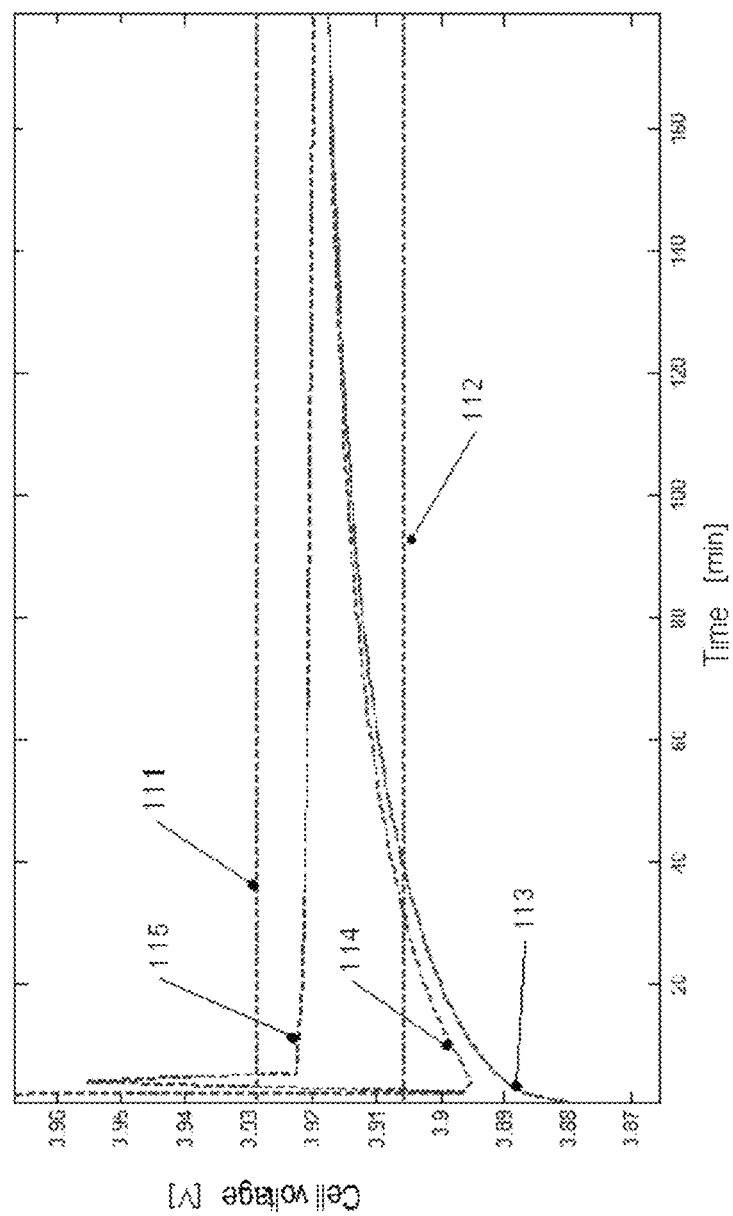
FIG. 11 shows graphs for illustrating the effects of techniques in accordance with exemplary embodiments.

Effects of the use of the precharacterization parameter dV in a method as described above, which additionally takes into consideration a history, are represented using an example in FIG. 11. A curve 113 in FIG. 11 shows a measured profile of the cell voltage. Lines 111, 112 show a desired accuracy for the determination of the open terminal voltage after 3 h, for example ±1 mV. A curve 114 shows the profile of an estimated open terminal voltage using a conventional method taking into consideration the history, but without the use of a precharacterization parameter. In this case, the desired accuracy is achieved after a measurement time of approximately 30 min, compared to approximately 40 min with a simple measurement. A curve 115, on the other hand, shows the profile of an extrapolated open terminal voltage using the precharacterization parameter corresponding to the methods in FIG. 10. In this case, the desired accuracy is already achieved after less than 10 min, i.e. measured values only need to be recorded for 10 min in order to be able to determine the value of the open terminal voltage after 3 h with the desired accuracy. Therefore, ultimately also a state of charge of the battery can then be determined with desired accuracy more quickly in exemplary embodiments of the present invention than in conventional procedures.

As already mentioned, in some exemplary embodiments, the precharacterization parameter dV can be recorded depending on various variables, for example a temperature or a state of charge. In order to be able to record a suitable precharacterization parameter, the state of charge can be determined approximately, for example by integration of the battery current over time starting from a previous state of charge and can be used to select the suitable precharacterization parameter dV. In this case, precharacterization parameters can be stored, as already mentioned, in a table, for example depending on temperature and state of charge.

Figure 12:
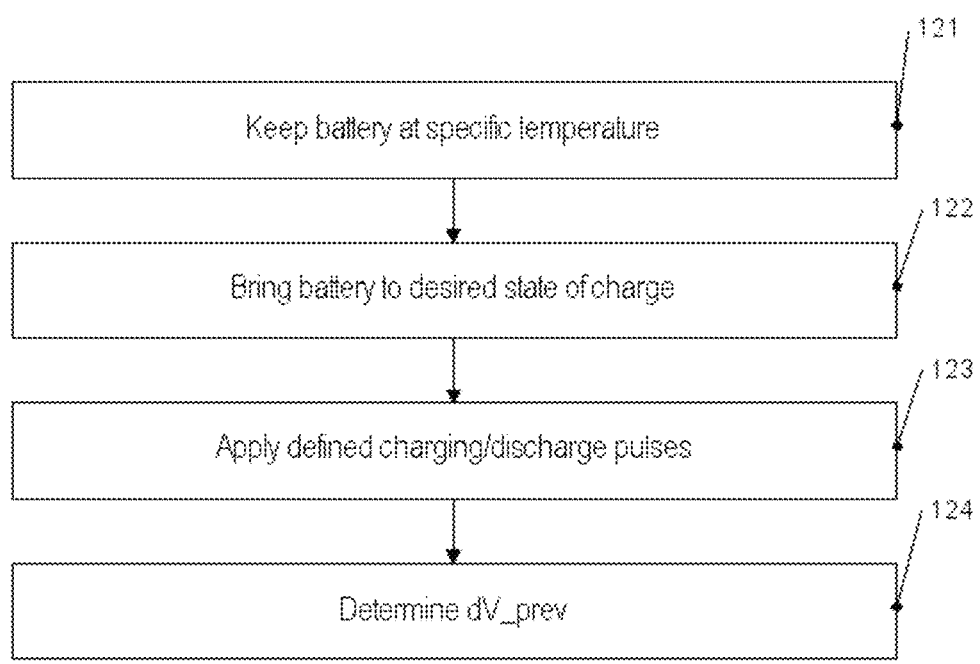
FIG. 12 shows a flow chart for illustrating a method in accordance with a further exemplary embodiment of the invention.

FIG. 12 illustrates schematically a method for determining precharacterization parameters for a specific cell type. This method can be implemented, for example, by a battery manufacturer or by a manufacturer of an apparatus for determining the state of charge for different types of batteries.

At 121, a battery to be characterized is brought to a specific temperature and kept at this temperature.

At 122, the battery is brought to a desired initial state of charge. At 123, defined charging/discharging pulses with defined current rates (for example 0.1 C, 0.5 C, 1 C, etc.) and preset pulse durations (for example 2 min, 4 min, 8 min, 16 min, etc.) are then used. After each charging or discharging, a rest period of 3 h can then be used, for example, and the terminal voltage can be measured after 100 s and after 3 h in order to then determine the parameters dV at 124 on the basis of an analysis of the relaxation phases. In other exemplary embodiments, as already explained, other times can also be selected instead of 100 s and 3 h.

Steps 122 to 124 can then be repeated for different states of charge, and steps 121 to 124 can be repeated for different temperatures in order thus to provide a table with precharacterization parameters. Then, as already explained, suitable precharacterization parameters can be selected from this table.

It should be noted that a subdivision is also in principle possible instead of a single precharacterization parameter for a duration from 100 s to 3 h, for example two precharacterization parameters can be provided, one for a time from 100 s to 1 h and a second for a time from 1 h to 3 h. Other types of precharacterization parameters which describe the relaxation process can also be used. The exemplary embodiments illustrated are therefore used merely for illustrative purposes and should not be interpreted as being restrictive.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   detecting a state with low current load of a battery;
   measuring a plurality of terminal voltage values of the battery at different points in time in the state with low current load, before the terminal voltage reaches a steady state;
   applying a correction value to each terminal voltage value measured in the state with low current load to yield corrected terminal voltage values, each correction value being based on a precharacterization parameter which describes a voltage difference during relaxation of the battery between a first time and a second time;
   estimating a value for an open terminal voltage of the battery in the steady state at a desired time based on the corrected terminal voltage values; and
   determining a state of charge of the battery based on the estimated value for the open terminal voltage of the battery in the steady state at the desired time.

2. The method of claim 1, wherein the first time is between 50 s and 200 s, and the second time is between 1 h and 4 h.

3. The method of claim 1, wherein the precharacterization parameter is selected from a set of stored precharacterization parameters depending on a state parameter describes a state of the battery.

4. The method of claim 3, further comprising scaling at least one of the stored precharacterization parameters based on the state parameter.

5. The method of claim 3, wherein the state parameter comprises a parameter selected from the group consisting of a temperature, a state of charge, a previous battery current and a duration of a previous battery current.

6. The method of claim 1, wherein the correction values correspond to a difference between the precharacterization parameter and an accumulated value for a voltage difference between the plurality of the terminal voltage values measured in the state with low current load measurements of the terminal voltage.

7. The method of claim 1, further comprising detecting at least one previous parameter describing a history of the battery prior to the state of low current load, wherein the determination of the state of charge is further based on the at least one previous parameter.

8. The method of claim 7, wherein the at least one previous parameter comprises a voltage across the battery and/or a battery current of the battery in a charging or discharging state prior to the state of low current load.

9. The method of claim 1, wherein applying a correction value to each terminal voltage value measured in the state with low current load comprises using the precharacterization parameter as an increment of an estimator for estimating the value for the open terminal voltage of the battery in the steady state at the desired time.

10. The method of claim 1, further comprising:
    updating an initial value of the precharacterization parameter for the terminal voltage value being instantaneously measured in the state with low current load, based on a difference between the terminal voltage value being instantaneously measured and a least measured terminal voltage value,
    wherein the updated value of the precharacterization parameter corresponds to a voltage difference accumulated over a plurality of measurements.

11. The method of claim 10, further comprising:
    applying a correction to the updated value of the precharacterization parameter for the terminal voltage value being instantaneously measured if the initial value of the precharacterization parameter for the terminal voltage value being instantaneously measured is greater than the updated value.

12. An apparatus, comprising:
    a detection apparatus configured to measure a plurality of terminal voltage values of a battery at different points in time in a state with low current load, before the terminal voltage reaches a steady state;
    a memory configured to store: precharacterization parameter which describes a voltage difference during relaxation of the battery between a first time and a second time; and
    an evaluation apparatus configured to:
    apply a correction value to each terminal voltage value measured in the state with low current load to yield corrected terminal voltage values, each correction value being based on the precharacterization parameter;
    estimate a value for n open terminal voltage of the battery in the steady state at a desired time based on the corrected terminal voltage values; and
    determine a state of charge of the battery based on the estimated value for the open terminal voltage of the battery in the steady state at the desired time.

13. The apparatus of claim 12, wherein the evaluation apparatus is configured to select the precharacterization parameter from a set of precharacterization parameters stored in the memory depending on state parameter which describes a state of the battery.

14. The apparatus of claim 13, wherein the state parameter comprises at least one parameter selected from the group consisting of a temperature, a state of charge, a previous battery current and a duration of a previous battery current.

15. The apparatus of claim 12, wherein the correction values correspond to a difference between the precharacterization parameter and an accumulated value of a voltage difference between the plurality of the terminal voltage values measured in the state with low current load.

16. The apparatus of claim 12, further comprising a further detection apparatus configured to detect at least one previous parameter which describes a history of the battery prior to the state of low current load, wherein the determination of the state of charge takes place depending on the at least one previous parameter.

17. The apparatus of claim 16, wherein the at least one previous parameter comprises a voltage across the battery and/or a battery current of the battery in a charging or discharging state prior to the state of low current load.

18. The apparatus of claim 12, wherein the evaluation apparatus is configured to update an initial value of the precharacterization parameter for the terminal voltage value being instantaneously measured in the state with low current load, based on a difference between the terminal voltage value being instantaneously measured and a last measured terminal voltage value, and wherein the updated value of the precharacterization parameter corresponds to a voltage difference accumulated over a plurality of measurements.

19. The method of claim 18, wherein the evaluation apparatus is configured to apply a correction to the updated value of the precharacterization parameter for the terminal voltage value being instantaneously measured if the initial value of the precharacterization parameter for the terminal voltage value being instantaneously measured is greater than the updated value.

20. The apparatus of claim 12, wherein the evaluation apparatus comprises an estimator, and wherein the evaluation apparatus is configured to use the precharacterization parameter as an increment of the estimator for estimating the value for the open terminal voltage of the battery in the steady state at the desired time.

* * * * *

UNITED STATES PATENT AND TRADEMARK OFFICE
CERTIFICATE OF CORRECTION

PATENT NO. : 9,897,657 B2
APPLICATION NO. : 14/601903
DATED : February 20, 2018
INVENTOR(S) : S. Marsili et al.

It is certified that error appears in the above-identified patent and that said Letters Patent is hereby corrected as shown below:

In the Claims

Column 13, Line 56 (Claim 3, Line 3) please change "parameter describes" to -- parameter which describes --

Column 14, Lines 2, 3 (Claim 6, Lines 5, 6) please change "current load measurements of the terminal voltage." to -- current load. --

Column 14, Line 24 (Claim 10, Line 6) please change "a least" to -- a last --

Column 14, Line 41 (Claim 12, Line 6) please change "store: precharacterization" to -- store a precharacterization --

Column 14, Line 51 (Claim 12, Line 16) please change "a value for n open" to -- a value for an open --

Column 14, Line 60 (Claim 13, Line 4) please change "on state" to -- on a state --

Signed and Sealed this
Twenty-fourth Day of April, 2018

Andrei Iancu
*Director of the United States Patent and Trademark Office*